United States Patent
Kim et al.

(10) Patent No.: US 9,641,145 B2
(45) Date of Patent: May 2, 2017

(54) APPARATUS AND METHOD FOR OUTPUTTING AUDIO ACCORDING TO AUDIO TABLES

(71) Applicant: Samsung Electronics Co. Ltd., Suwon-si, Gyeonggi-do (KR)

(72) Inventors: Yang-Su Kim, Suwon-si (KR); Chul-Hwan Lee, Seoul (KR); Mi-Hyang Kim, Suwon-si (KR); Jun-Tai Kim, Yongin-si (KR); Nam-Ii Lee, Suwon-si (KR); Yong-Hoon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 690 days.

(21) Appl. No.: 13/872,736

(22) Filed: Apr. 29, 2013

(65) Prior Publication Data

US 2013/0287215 A1 Oct. 31, 2013

(30) Foreign Application Priority Data

Apr. 28, 2012 (KR) ........................ 10-2012-0045016

(51) Int. Cl.
| | | |
|---|---|---|
| *H03G 3/00* | (2006.01) | |
| *H03G 5/00* | (2006.01) | |
| *H03G 9/00* | (2006.01) | |
| *H03G 3/20* | (2006.01) | |
| *H04M 1/60* | (2006.01) | |
| *H04M 1/725* | (2006.01) | |

(52) U.S. Cl.
CPC ............ *H03G 3/20* (2013.01); *H04M 1/6016* (2013.01); *H04M 1/72569* (2013.01)

(58) Field of Classification Search
CPC .... H03G 3/001; H03G 3/20; H03G 5/16; H03G 5/18; H03G 9/02; H04M 1/6016; H04M 1/72569
USPC ................................ 381/104, 107, 101, 102
See application file for complete search history.

(56) References Cited

U.S. PATENT DOCUMENTS

| | | | | |
|---|---|---|---|---|
| 5,872,852 | A * | 2/1999 | Dougherty | ............... H03G 3/32 381/104 |
| 2003/0123680 | A1 * | 7/2003 | Lee | ......................... G06F 3/165 381/104 |

(Continued)

FOREIGN PATENT DOCUMENTS

| | | |
|---|---|---|
| CN | 1617546 A | 5/2005 |
| KR | 10-2010-0011426 A | 2/2010 |
| WO | 2007/049222 A1 | 5/2007 |

*Primary Examiner* — Vivian Chin
*Assistant Examiner* — Douglas Suthers
(74) *Attorney, Agent, or Firm* — Jefferson IP Law, LLP (57) ABSTRACT

An apparatus and method for outputting audio signals of a portable communication device are provided. The apparatus includes a plurality of audio tables including different volume control values or tone control values, and allows a user to selectively set audio tables corresponding to each of audio paths equipped with the portable communication device. Further, the apparatus analyzes a surrounding environment during a voice call, determines the absence or presence of noise, and suitably controls a volume or a tone of audio signals based on the result of the determination before outputting the audio signals. Accordingly, the apparatus can provide an improved calling condition in various calling environments.

18 Claims, 5 Drawing Sheets

(56) References Cited

U.S. PATENT DOCUMENTS

| | | | |
|---|---|---|---|
| 2007/0081675 A1* | 4/2007 | Kim | H04H 60/65 381/10 |
| 2008/0187149 A1* | 8/2008 | Jung | H03G 5/165 381/72 |
| 2010/0086149 A1* | 4/2010 | Kuroda | H03G 7/002 381/103 |
| 2010/0179809 A1 | 7/2010 | Lee | |

* cited by examiner

APPARATUS AND METHOD FOR OUTPUTTING AUDIO ACCORDING TO AUDIO TABLES

PRIORITY

This application claims the benefit under 35 U.S.C. §119 (a) of a Korean patent application filed on Apr. 28, 2012 in the Korean Intellectual Property Office and assigned Serial No. 10-2012-0045016, the entire disclosure of which is hereby incorporated by reference.

BACKGROUND OF THE INVENTION

1. Field of the Invention

The present invention relates to an audio output during a voice-calling using a portable communication device. More particularly, the present invention relates to an apparatus and method for outputting audio, which are capable of providing an optimum voice-calling condition even in a loud environment.

2. Description of the Related Art

A user can perform a voice-call in various environments using a portable communication device. For example, the user can perform the telephone-call by directly contacting the speaker of the portable communication terminal to the user's ear, by using an earphone or an ear-microphone, or by using a speaker phone. Accordingly, the portable communication terminal includes a plurality of speakers and a jack connector to which an earphone or ear-microphone can be connected. Further, the portable communication terminal has a plurality of audio reproduction paths which are connected to each speaker and the jack connector.

The user can select a volume level using a volume up/down key and control the volume of output audio during the voice communication. Therefore, the portable communication terminal includes an audio table for use in control of the volume of the output audio. The audio table lists magnitudes of the output audio volume at each stage depending on volume levels, which can be shown in a Table 1 as follows.

TABLE 1

| Volume level | Volume value |
|---|---|
| Max | $V_n$ |
| Max − 1 | $V_{n-1}$ |
| ... | ... |
| Max − n − 1 | $V_1$ |
| Max − n | 0 |

In Table 1, Max indicates a maximum volume level, Max-n indicates a minimum volume level, and 0 to $V_n$ indicate volume values.

Generally, the portable communication device includes an audio table which may be configured as Table 1 and corresponds to each audio reproduction path. The maximum volume values of each audio table corresponding to the respective audio reproduction paths, or a variation of the volume at each volume level can be different from one another. Therefore, the portable communication terminal controls and outputs the volume of an audio signal by using an audio table which corresponds to an audio reproduction path connected to an output unit through which a user outputs the audio signal, when the user operates a volume up/down key to input a volume up or volume down signal.

As described above, portable communication devices of the related art include an audio table fixedly corresponding to each audio reproduction path.

However, an environment in which the user performs a call may not be maintained constantly. For example, a quiet call environment can be maintained when the user is at home, but a loud call environment can be produced around the user when the user is located at a place such as a road, a shopping mall, and the like.

Nevertheless, the portable communication device can control and output only the volume of the audio signal in a limited range by using the audio table fixed to each audio reproduction path, regardless of a surrounding environment. Accordingly, there is a problem in that an optimum call condition cannot be provided to the user.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide an apparatus and method for changing volume and tone of output audio signals during a voice-call.

Another aspect of the present invention is to provide an apparatus and method for controlling and outputting volume and tone of audio signals based on a call environment.

Still another aspect of the present invention is to provide an apparatus and method for selectively setting various audio tables to correspond to each audio reproduction path depending on a user's selection.

In accordance with an aspect of the present invention, a method of outputting audio signals of a communication device is provided. The method includes receiving an input, selecting an audio table, which includes a value for changing at least one of a tone and a volume of output audio signals, among a plurality of audio tables, based on the received input, and changing the volume of the output audio signals depending on a tone value or a volume value included in the selected audio table.

In accordance with another aspect of the present invention, a communication device is provided. The device includes input/output module for receiving an input, and an audio table selection and application unit for selecting an audio table which includes a value capable of changing at least one of a tone and a volume of an output audio signal, among a plurality of audio tables, based on the received input, and for changing a volume of the output audio signal depending on a tone value or a volume value included in the selected audio table.

In accordance with still another aspect of the present invention, a method of outputting an audio signal of a portable communication device is provided. The method includes receiving a request for a change of an audio table with relation to a certain reproduction path among reproduction paths which are respectively connected to an audio signal output unit, and changing an audio table applicable to the certain reproduction path in response to the request for change, wherein the portable communication device includes a plurality of audio tables which respectively include a basic audio table and at least one custom audio table, and wherein a volume value of the custom audio table corresponding to a certain volume level is larger than a volume value of the basic audio table.

In accordance with another aspect of the present invention, a portable communication device is provided. The portable communication device includes at least one audio signal output unit, a storage unit for storing a plurality of audio tables, and an audio table selection and application unit for receiving a request for a change of an audio table with relation to a certain reproduction path among reproduction paths which are respectively connected to each of the audio signal output units, and for changing an audio table applicable to the certain reproduction path in response to the request for the change, wherein the plurality of audio tables include a basic audio table and at least one custom audio table, and wherein a volume value of the custom audio table corresponding to a certain volume level is larger than a volume value of the basic audio table.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention are to provide an optimum call condition in different call environments. Accordingly, exemplary embodiments of the present invention provide a plurality of audio tables having different volume control values or tone control values and enable a user to selectively set an audio table to correspond to each audio reproduction path equipped to a portable communication device. Further, exemplary embodiments of the present invention analyze a surrounding environment during a voice-call, determine the absence or the presence of noise, and appropriately control and output a volume or a tone of audio signals based on a result of the determination.

Figure 1:
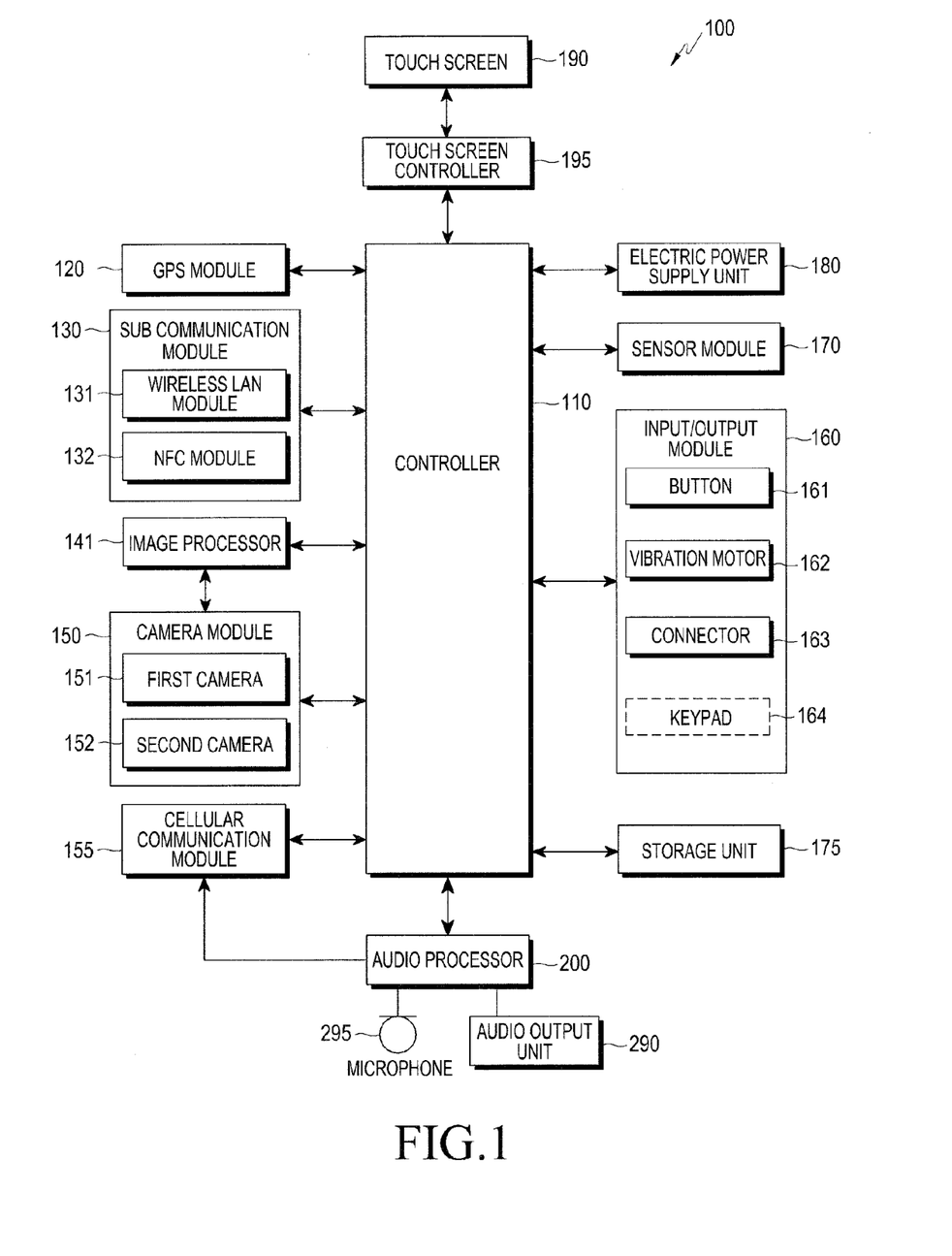
FIG. 1 is a block diagram illustrating a configuration of a portable communication device according to an exemplary embodiment of the present invention.

An example of the communication device to which exemplary embodiments of the present invention is applied, is shown in FIG. 1.

FIG. 1 is a block diagram illustrating a configuration of a communication device according to an exemplary embodiment of the present invention.

Referring to FIG. 1, the communication device 100 can be connected to an external device (not shown) by using a cellular communication module 155, a sub-communication module 130, and a connector 163. The "external device" includes another device (not shown), a portable phone (not shown), a smart phone (not shown), a tablet PC (not shown), a server (not shown, and the like).

The communication device 100 includes a touch screen 190 and a touch screen controller 195. Further, the communication device 100 includes a controller 110, the cellular communication module 155, the sub-communication module 130, an image processor 141, a camera module 150, a GPS module 120, an input/output module 160, a sensor module 170, a storage unit 175, an electric power supply unit 180, an audio processor 200, an audio output unit 290, and a microphone 295.

The sub-communication module 130 includes at least one of a wireless LAN module 131 and a Near Field Communication (NFC) module 132, and the camera module 150 includes at least one of a first camera 151 and a second camera 152. The input/output module 160 includes at least one of a button 161, a vibration motor 162, the connector 163, and a keypad 164.

The controller 110 is a processor which controls an operation of the communication device 100 by using a ROM having a control program stored therein to control the communication device 100 and a RAM having signals or data input from an exterior of the communication device 100 and used as a memory region to perform an operation in the communication device 100. The controller 100 can include a single-core processor, a dual-core processor, a triple-core processor, or a quad-core processor.

The controller 110 can control the cellular communication module 155, the sub-communication module 130, the image processor 141, the camera module 150, the GPS module 120, the input/output module 160, the sensor module 170, the storage unit 175, the electric power supply unit 180, the touch screen 190, and the touch screen controller 195.

The cellular communication module 155 connects the communication device 100 to an external device through a mobile communication system using one or more antennas (not shown) under control of the controller 110. The cellular communication module 155 transmits and receives radio signals for a voice call, a video call, a Short Message Service (SMS), or a Multimedia Messaging Service (MMS) to/from a portable phone (not shown), a smart phone (not shown), a tablet PC or another device (not shown), which has telephone numbers input in the communication device 100

The sub-communication module 130 can include at least one of the wireless LAN module 131 and the NFC module 132. For example, the sub-communication module 130 can include only the wireless LAN module 131, only the NFC module 132, or both the wireless LAN module 131 and the NFC module 132.

The wireless LAN module 131 may be in contact with the Internet under control of the controller 110 at a place where a wireless Access Point (AP, not shown) is established. The wireless LAN module 131 may support the wireless LAN standard (IEEE802.11x) of the Institute of Electrical and Electronics Engineers (IEEE). The NFC module 131 can carry out a wireless near field communication between the communication device 100 and a video forming device (not shown) under the control of the controller 110. An NFC scheme may include Bluetooth, Infrared Data Association (IrDA), and the like.

The communication device 100 may include at least one of the cellular communication module 155, the wireless LAN module 131, and the NFC module 132 depending on its capability. Further, the communication device 100 may include the combination of the cellular communication module 155, the wireless LAN module 131, and the NFC module 12

The image processor 141 controls an operation of the cameras 151 and 152 under the control of the controller 110. Further, the image processor 141 processes a quality of image data gained by an image sensor, and changes and outputs a format of the image data. The controller 110 stores the input image data in the storage unit 175.

The camera module 150 can include at least one of the first camera 151 and the second camera 152 which take a stationary picture or moving pictures under the control of the controller 110. Further, the first camera 151 or the second camera 152 may include an auxiliary light source (i.e., flash, not shown) supplying a quantity of light needed to take a picture. The first camera 151 is disposed on a front surface of the communication device 100, and the second camera 152 is disposed on a rear surface of the communication device 100. In another way, the first camera 151 and second camera 152 are disposed adjacent to each other so as to take a three-dimensional stationary picture or three-dimensional moving pictures.

The GPS module 120 can receive electric waves from a plurality of GPS satellites (not shown) on Earth orbit, and determine a position of the communication device 100 using a time of arrival of the electric waves from the GPS satellites to the communication device 100.

The input/output module 160 includes at least one of the plurality of buttons 161, the vibration motor 162, the connector 163, and the keypad 164.

The button 161 may be mounted on the front surface, a side portion, or the rear surface of a housing of the communication device 100, and includes at least one of an electric power source/lock button (not shown), a volume button (not shown), a menu button, a home button, a back button, and a search button. According to exemplary embodiments of the present invention, the button 161 may include an audio alteration button which generates an audio alteration signal when it is actuated during the execution of a voice call or a video call or output of audio signals through an audio output unit. The audio alteration button may include a separate exclusive button equipped to the communication device 100. Further, one of the buttons equipped to the communication device 100 may be configured to operate as the audio alteration button during a voice call or for controlling the output of audio signals.

The vibration motor 162 converts electric signals into mechanical vibration under the control of the controller 110. For example, the communication device 100 in a vibration mode actuates the vibration motor 164 upon receiving a voice call from another device (not shown). One or more vibration motors may be disposed in the housing of the communication device 100. The vibration motor 164 operates in response to a user's touch operation to touch the touch screen 190 and a continuous touch movement on the touch screen 190.

The connector 163 can be used as an interface to connect the communication device 100 with an external device (not shown) or an electric power source (not shown). Under the control of the controller 110, the communication device 100 can transmit data, which are stored in the storage unit 175 of the communication device 100, to the external device through a wire cable connected to the connector 163, or receive data from the external device. Further, electric power can be input from the electric power source through the wire cable connected to the connector 163, or charge a battery (not shown).

The keypad 164 receives key inputs from a user in order to control the communication device 100. The keypad 164 includes a physical keypad (not shown) mounted on the communication device 100 or a virtual keypad (not shown) displayed on the touch screen 190. The physical keypad mounted on the communication device 100 may be excluded depending on the capability or configuration of the communication device 100. The keypad 164 may include an audio alteration button according to exemplary embodiments of the present invention.

The sensor module 170 includes at least one sensor for detecting the condition of the communication device 100. For example, the sensor module 170 may include a proximity sensor for detecting whether a user is proximal to the communication device 100, a luminance sensor (not shown) for detecting an amount of light around the communication device 100, a motion sensor (not shown) for detecting a movement of the communication device 100 (i.e., a rotation of the communication device, acceleration or vibration applied to the communication device, etc.), and the like. At least one sensor detects the condition of the communication device 100, and generates and transmits a signal corresponding to the detection to the controller 110. The sensors of the sensor module 170 can be added or removed depending on the capability of the communication device 100.

The storage unit 175 stores signals or data input/output to correspond to operations of the cellular communication module 155, the sub-communication module 130, the image processor 141, the camera module 150, the GPS module 120, the input/output module 160, the sensor module 170, and the touch screen 190, under the control of the controller 110. The storage unit 175 can store a control program and applications for controlling the communication device 100 or the controller 110.

The term "storage unit" refers to the storage unit 175, a ROM, a RAM, or a memory card (i.e., an SD card, a memory stick, etc.) (not shown) mounted on the communication device 100. The storage unit may include a non-volatile memory, a volatile memory, a Hard Disc Drive (HDD), or a Solid State Drive (SSD).

The electric power supply unit 180 can supply electric power to one or more batteries which are disposed in the housing of the communication device 100. Further, the electric power supply unit 180 can supply electric power from an external electric power source (not shown) to the communication device 100 through a wire cable connected to the connector 163.

The touch screen 190 can provide a user with a user interface corresponding to various services (i.e., calling, data transmission, broadcasting, photographing, etc.), and includes a displaying screen. The touch screen 190 can transmit an analog signal corresponding to at least one touch which is input to the user interface.

The microphone 295 receives and converts voice or sound into electric signals, and outputs the electric signals to the audio processor 200.

The audio output unit 290 can output sounds corresponding to a variety of signals (i.e., radio signal, broadcasting signal, digital audio file, digital video file, photographing, or the like) of the cellular communication module 155, the sub-communication module 130, or the camera module 150 to the outside of the communication device 100 under the control of the audio controller 200. The audio output unit 290 can output sounds (i.e., button operation sound, ringtone corresponding to a call, etc.) corresponding to functions which the communication device 100 performs.

The audio output unit 290 includes a plurality of audio output devices. The audio output devices may be, for example, speakers and a jack connector to which an earphone or an ear-microphone is connected. Accordingly, the audio output unit 290 includes at least one speaker and at least one jack connector. As having included plural audio output devices, the audio output unit 290 includes a plurality of reproduction paths to connect the audio processor 200 and each audio output device.

The audio processor 200 is connected to the microphone 295, converts analog audio signals, which are input from the microphone 295, into digital audio signals, and encodes the digital audio signals to compressed audio signals before outputting the compressed audio signals to the controller 110 or the cellular communication module 155.

The audio processor 200 decodes and converts compressed audio signals, which are input from the cellular communication module 155, into digital audio signals. Further, the audio processor 200 converts the digital audio signals into analog audio signals before outputting the analog audio signals to the audio output unit 290. At this time, the audio processor 200 enables the analog audio signals to be applied to an active reproduction path.

The active reproduction path is connected to an audio output device, which is configured to output audio signals, among the plurality of audio output devices included in the audio output unit 290. For example, on the condition that a jack of the earphone or the ear-microphone is inserted into the jack connector, the active reproduction path may be a reproduction path connecting the audio processor 200 with the jack connector. On the other hand, even though the jack of the earphone is inserted in the jack connector, the active reproduction path may be a reproduction path connecting the audio processor 200 with the speaker when the communication device 100 is set in a speaker phone mode.

According to exemplary embodiments of the present invention, the audio processor 200 stores a plurality of audio tables which respectively have different volume control values or tone control values from one another, and enables a user to selectively set an audio table corresponding to each reproduction path depending on noise and environment around the user. Further, the audio processor 200 analyzes the environment around the user while the user makes a call, and determines the presence or absence of noise. As a result, the audio processor 200 can apply an audio table in which a volume or a tone of audio signals is suitably regulated.

Figure 2:
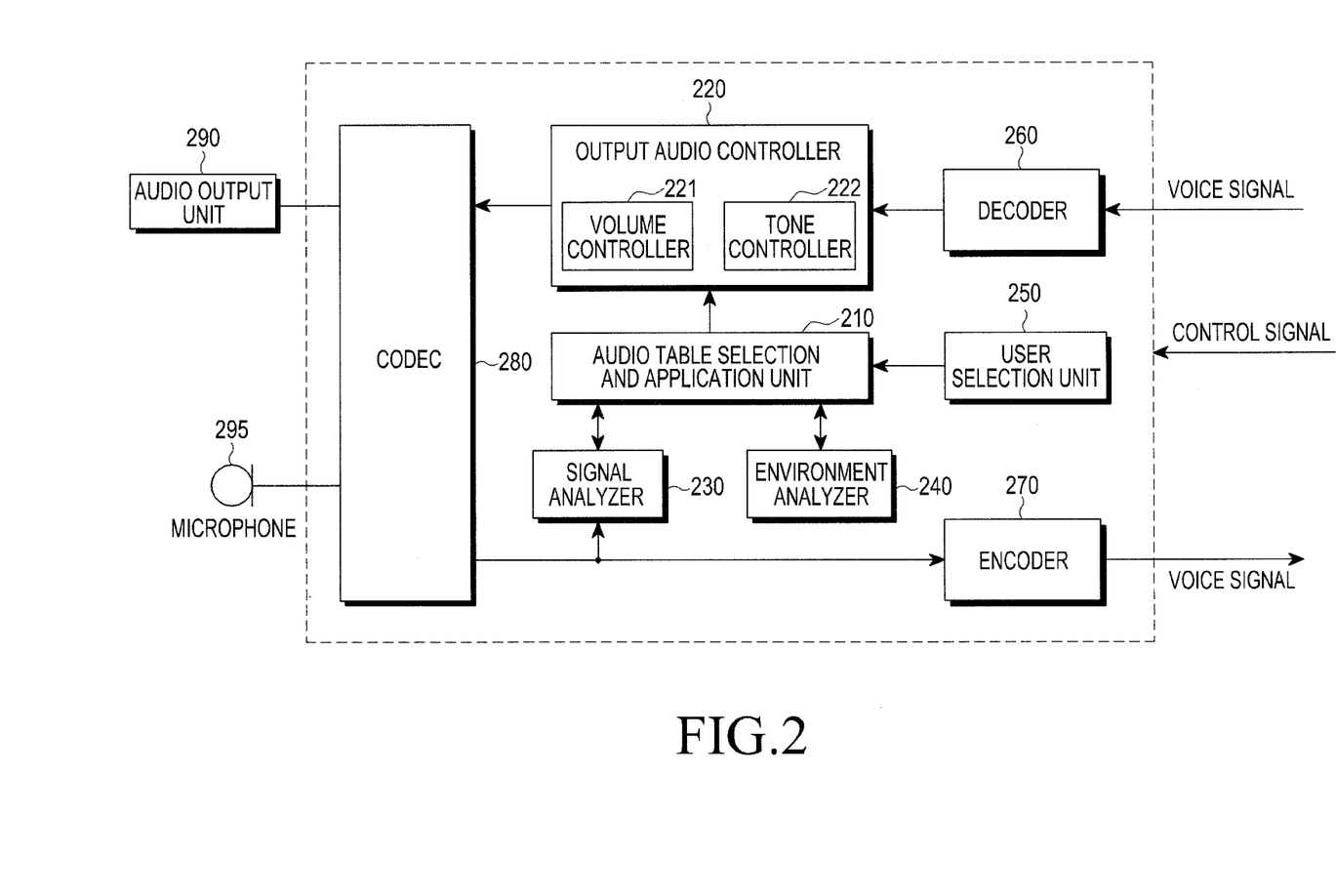
FIG. 2 is a block diagram illustrating a configuration of an audio processor according to an exemplary embodiment of the present invention.

FIG. 2 shows the configuration of an audio processor according to an exemplary embodiment of the present invention.

Referring to FIG. 2, the audio processor includes an audio table selection and application unit 210, an output audio controller 220, a signal analyzer 230, an environment analyzer 240, a user selection unit 250, a decoder 260, and an encoder 270.

A codec 280 converts analog audio signals, which are input from the microphone 295, into digital audio signals, and outputs the digital audio signals to the encoder 270. Further, the codec 280 converts digital audio signals, which are input from the decoder 260 through the output audio controller 220, into analog audio signals, and outputs the analog audio signals to the audio output unit 290.

The encoder 270 encodes the digital audio signals, which are input from the codec 280, to compressed audio signals, and outputs the compressed audio signals to the controller 110 or the cellular communication module 155.

The decoder 260 decodes the compressed audio signals, which are input from the controller or the cellular communication module 155, to digital audio signals, and outputs the digital audio signals to the output audio controller 220.

The audio table selection and application unit 210 stores the plurality of audio tables, and selects and applies an audio table to a corresponding reproduction path depending on an audio output mode set to each reproduction path. According to exemplary embodiments of the present invention, the plurality of audio tables may be stored in the storage unit 175.

Audio output modes can be classified into a default mode and a custom mode. In the default mode, a basic audio table is applied to each reproduction path. In the custom mode, a user can select and apply an audio table to each reproduction path depending on the environment around the communication device 100, for example, depending on the amount of noise around the communication device 100. The audio output mode can be differently set for each reproduction path.

The custom mode includes at least one of three mode types such as a user selection mode, a noise detection mode, and an environment analysis mode. The user selection mode is to apply a predetermined audio table instead of the basic audio table according to a user selection. The noise detection mode is to select and apply an audio table based on noise included in audio signals collected through the microphone 295. The environment analysis mode is to select and apply an audio table as a result of environment analysis around the communication device 100.

The audio table is a list in which a volume value, a tone value, or the combination of the volume value and the tone value of output signals at each level are tabled. The volume value is a magnitude of the entire volume of the output audio and can be indicated by decibel. The tone value indicates the tone of the output audio, and can be expressed by an audio variation value corresponding to each of plural frequency sections which are included in all frequency bands corresponding to the output audio signals. For example, a decreased value is set to lower the volume value with relation to a first frequency section in a range equal to or lower than 400 Hz. A variation value is not employed in order to hold an original volume value with relation to a second frequency section in a range of 400 Hz to 1 kHz. An increased value is set to increase a volume value with relation to a third frequency section in a range of equal to or higher than 1 kHz. The volume value in the low frequency band is decreased and the volume value in the high frequency band is increased so that the clarity of output audio can be improved.

According to exemplary embodiments of the present invention, the audio table can be classified into a basic audio table and a custom audio table. The basic audio table is set in a default condition in order to correspond to each of the plural reproduction paths when an audio output mode is in the general mode, and includes only volume values of each level. An example will be shown in Table 2 as follows.

TABLE 2

| Volume Level | Volume Value |
| --- | --- |
| Max | $V_n$ |
| Max − 1 | $V_{n-1}$ |
| ... | ... |
| Max − n − 1 | $V_1$ |
| Max − n | 0 |

In Table 2, Max indicates the maximum volume level, Max-n indicates the minimum volume level, and 0 to $V_n$ respectively indicate the volume value of each volume level.

The custom audio table is selectively set by a user for each reproduction path, and can be selected in the noise detection mode or the environment analysis mode if necessary. The custom audio table includes at least one of the volume value and the tone value depending on its mode. Examples of custom audio tables are shown in Tables 3 to 7 as follows.

TABLE 3

| Volume Level | Volume Value |
| --- | --- |
| Max | $V_n + a$ |
| Max − 1 | $V_{n-1} + a$ |
| ... | ... |
| Max − n − 1 | $V_1 + a$ |
| Max − n | 0 |

Table 3 is an audio table for a constant volume variation, in which the volume value is changed by a certain value, and indicates that an additional value is added by a predetermined value a to the volume value of each level in the basic audio table.

TABLE 4

| Volume Level | Volume Value |
| --- | --- |
| Max | $V_n + an$ |
| Max − 1 | $V_{n-1} + an - 1$ |
| ... | ... |
| Max − n − 1 | $V_1 + a1$ |
| Max − n | 0 |

Table 4 is an audio table for an individual volume variation, in which the volume value is individually changed, and indicates that a different additional value at each level, i.e., additional values a1 to an−1, is added to the volume value of each level in the basic audio table.

TABLE 5

| Volume Level | Volume Value | Tone Value |
| --- | --- | --- |
| Max | $V_n$ | b |
| Max − 1 | $V_{n-1}$ | b |
| ... | ... | ... |
| Max − n − 1 | $V_1$ | b |
| Max − n | 0 | 0 |

Table 5 is an audio table for a tone variation, in which a tone value b is added to the volume value of each level in the basic audio table. The tone value b includes a decreased value for lowering the volume value with relation to the frequency band in a range equal to or lower than 400 Hz, and an increasing value for raising the volume value with relation to the third frequency band in a range equal to or higher than 1 kHz.

TABLE 6

| Volume Level | Volume Value | Tone Value |
| --- | --- | --- |
| Max | $V_n + a$ | b |
| Max − 1 | $V_{n-1} + a$ | b |
| ... | ... | ... |
| Max − n − 1 | $V_1 + a$ | b |
| Max − n | 0 | 0 |

Table 6 is an audio table for a constant volume/tone variation, in which the tone value b is added to the volume value in the custom audio table indicated in Table 3.

TABLE 7

| Volume Level | Volume Value | Tone Value |
| --- | --- | --- |
| Max | $V_n + an$ | b |
| Max − 1 | $V_{n-1} + an - 1$ | b |
| ... | ... | ... |
| Max − n − 1 | $V_1 + a1$ | b |
| Max − n | 0 | 0 |

Table 7 is an audio table for an individual volume/tone variation, in which the tone value b is added to the volume value in the custom audio table indicated in Table 4.

The audio table selection and application unit 210 provides a user interface which enables a user to set an audio output mode through the touch screen 190. Accordingly, the user can set one of the basic mode and the custom mode as the audio output mode. In the setting of the custom mode, one of the custom mode types is automatically set, or can be set by the user. For example, on the condition that the portable communication device includes only a user selection mode in the custom mode, the audio table selection and application unit can apply not the basic audio table but a predetermined audio table among the plurality of custom audio tables to the corresponding reproduction path when the user selects the custom mode.

Further, the audio table selection and application unit provides the user with a list of reproduction paths and a list of plural custom audio tables, and allows the user to designate a certain custom audio table for each reproduction path. That is, in a case of applying the user selection mode, the audio table selection and application unit 210 displays the list of the reproduction paths and information on the custom audio tables indicated in Tables 3 to 7 on the touch screen 190. Therefore, the user can designate and apply a desired custom audio table to each reproduction path, or a predetermined custom audio table when the portable communication terminal is shipped, can automatically be applied.

On the condition that the user selection mode is set, at each time that a signal of an audio alteration button is input while voice calling or video calling is executed, or the audio signals are output through the audio output unit, one of the plural custom audio tables may be arbitrarily selected and applied to the active reproduction path. At this time, the custom audio table may be randomly selected each time that the signal of the custom audio alteration button is input, or can be systematically selected in a predetermined order. Where the custom audio table is systematically selected in the predetermined order, the basic audio table may be selected when the selection for all custom audio tables is completed.

Furthermore, where the portable communication device supports a plurality of custom mode types, a menu may be provided in order for a user to select one of the plural custom mode types.

It is possible to set the audio output mode through the menu as described above. Also, it is possible to set one of the plural custom mode types to the active reproduction path when an audio alteration signal is generated while voice calling is executed or an audio signal is output according to an exemplary embodiment of the present invention.

Furthermore, it is possible to set a predetermined custom mode type of the plural custom mode types when an audio alteration signal is generated while voice calling is performed or an audio signal is output.

Where the predetermined custom mode type is a user setting mode, or the custom mode type which the communication device 100 supports includes only a user setting mode, one of the plural custom audio tables, or the predetermined audio table may be arbitrarily selected and applied to the active reproduction path.

The output audio controller 220 regulates the volume or tone of the digital audio signals which are input from the decoder 260, in response to the control of the audio table selection and application unit 210, before outputting the digital audio signals to the codec 280. The output audio controller 220 includes a volume controller 221 and a tone controller 222.

The audio table selection and application unit 210 sets a tone value for the tone controller 222, and the tone controller 222 regulates the volume in each frequency band of the digital audio signal depending on the set tone value.

Figure 5:
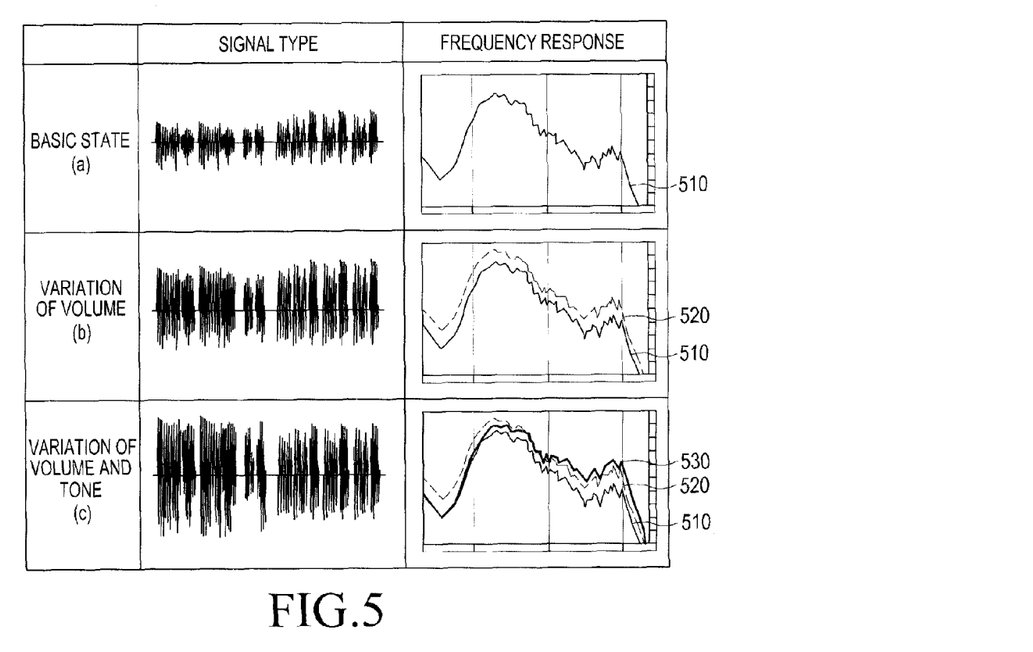
FIG. 5 shows frequency responses when the volume or tone of the audio signals is changed according to an exemplary embodiment of the present invention.

FIG. 5 shows frequency responses when the volume or tone of the audio signal is changed according to an exemplary embodiment of the present invention.

Referring to FIG. 5, frame (a) shows a signal format and a frequency response 510 of a basic audio signal, frame (b) shows a signal format and a frequency response 520 of a signal when the volume of the basic audio signal is regulated, and frame (c) shows a signal format and a frequency response 530 of a signal when the volume and tone of the basic audio signal are regulated.

Under the control of the audio table selection and application unit 210, the signal analyzer 230 analyzes audio signals collected by the microphone 295 and determines the extent of noise generated in an environment around the communication device 100. The signal analyzer 230 analyzes and divides digital audio signals, which are output from the codec, into voice and noise, and analyzes volume and frequency elements when the noise is present in the digital audio signals. Different techniques can be used to divide the digital audio signals into the voice and noise. For example, a Voice Activity Detection (VAD) technique is available. The signal analyzer 230 outputs noise detection information to the audio table selection and application unit 210. The noise detection information may include information on the absence or presence of noise and detected noise. In a case of the presence of noise, the noise detection information includes a frequency band of the noise and the volume of the noise corresponding to the frequency band.

The environment analyzer 240 gains a present location of the communication device 100 or peripheral images, and determines the absence or presence of noise, in response to the control of the audio table selection and application unit 210. In other words, the environment analyzer 240 is associated with the GPS module 120 so as to gain information on a location of the communication device 100, and determines the absence or presence of noise and a kind of the noise, based on the location of the communication device 100. For example, when the present location of the communication device 100 is on a road, the environment analyzer 240 determines that there is the presence of noise caused by a vehicle. Further, when the present location of the communication device 100 is in a cafeteria, the environment analyzer 240 determines that there is the presence of noise caused by conversations of people. Of course, these are merely examples of locations associated with noise and not to be construed as limiting application of the present invention.

The environment analyzer 240 is associated with the camera module 150 and the image processor 141 to gain images around the communication device 100, and determines the absence or the presence of noise and a type of the noise by analyzing the images. For example, when the environment analyzer 240 carries out a recognition of faces on the images around the communication device 100 and identifies that more than the certain number of people are included in the images, it determines that noise caused by conversations of people is present. On the other hand, when vehicles are included in the peripheral images, the environment analyzer 240 determines that noise caused by the vehicles is present.

The environment analyzer 240 can determine the absence or the presence of noise based on location information and at least one image among the peripheral images, and outputs environment information including the result to the audio table selection and application unit 210.

On the condition that the noise detection mode is set, the audio table selection and application unit 210 activates the signal analyzer 230 to obtain noise detection information, and selects a suitable audio table depending on the noise detection information. In turn, the audio table selection and application unit 210 sets a volume value or a tone value included in the selected audio table to the output audio controller 220.

For example, if the noise detection information indicates the absence of noise, the audio table selection and application unit 210 selects the basic audio table as indicated in Table 2, and sets a volume value to the audio controller 220 depending on the basic audio table.

On the other hand, where the noise detection information includes a frequency band and a volume value with relation to the noise, the audio table selection and application unit 210 divides a noise frequency band corresponding to the noise into a plurality of frequency bands, and compares the noise volume in each section of the divided frequency bands with a reference value. As a result, when the noise volume is larger than the reference value, the audio table selection and application unit 210 selects at least one of the tone change audio table and the volume change audio table.

After the noise frequency band is divided into two frequency sections, the volume values of the two frequency sections are compared with the reference value. If volume values of the two frequency sections are smaller than the reference value, the audio table selection and application unit 210 selects the basic audio table, and sets a volume value corresponding to the basic audio table to the audio controller 220. The reference value is a value to determine the extent of harmfulness of the noise. When the volume of the noise is smaller than the reference value even though the noise is present in the surrounding area, it is unnecessary to additionally regulate the volume value based on the basic audio table because the noise does not cause inconvenience to a user during the voice call.

However, when the noise volume of a part of the entire frequency bands is larger than the reference value, it is determined that the noise is harmful. Therefore, an audio table capable of changing the volume value of the output audio to the extent of a significantly larger value than the volume value set in the basic audio table, or the audio table capable of changing the tone must be selected.

If the noise volume in only lower frequencies of the two frequency bands is larger than the reference value, the audio table selection and application unit 210 selects the tone change audio table as indicated in Table 5, and sets the tone value to the audio controller 220, based on Table 5. As a result, it is possible to output an audio with high clarity.

On the other hand, if the noise volume in only higher frequencies of the two frequency bands is larger than the reference value, the audio table selection and application unit 210 selects the volume change audio table as indicated in Table 3 or 4, and sets the volume value to the audio controller 220, based on Table 3. Therefore, it is possible to output an audio with high clarity at each volume level.

If the noise volume is larger than the reference value in both of the two frequency bands, the audio table selection and application unit 210 selects the audio table which is capable of simultaneously regulating both the volume value and the tone value, as indicated in Table 6 or 7, and sets the volume value and the tone value to the audio controller 220, based on the audio table.

On the condition that the environment analysis mode is set, the audio table selection and application unit 210 activates the environment analyzer 240 to obtain environment information. If the environment information indicates a noisy environment, the audio table selection and application unit 210 selects an audio table capable of regulating at least one of the volume value and the tone value as indicated in Tables 3 to 7.

Figure 3:
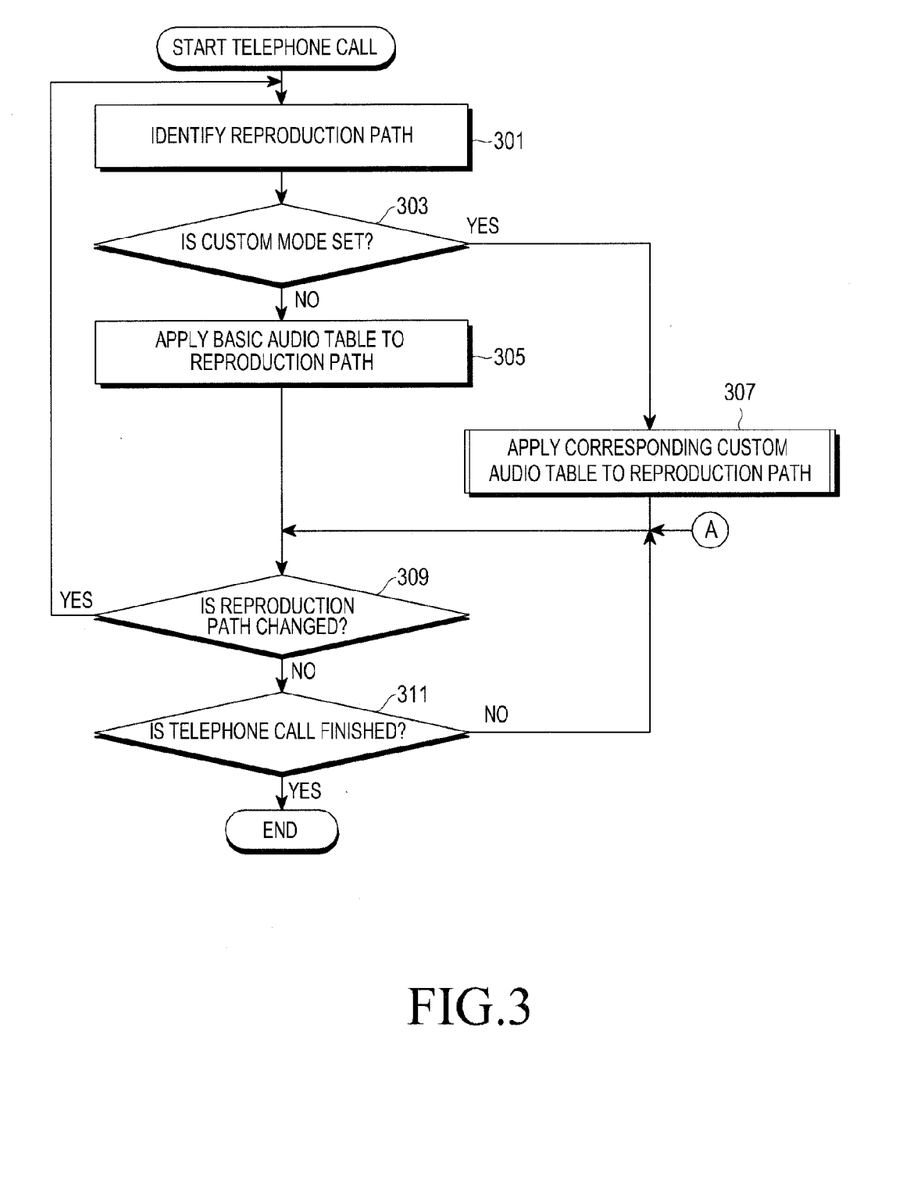
FIG. 3 is a flowchart illustrating processes of outputting audio signals according to an exemplary embodiment of the present invention.

FIG. 3 is a flowchart illustrating a process of outputting audio signals according to an exemplary embodiment of the present invention.

Referring to FIG. 3, the audio table selection and application unit 210 identifies an active reproduction path when the voice calling starts in step 301. In step 303, the audio table selection and application unit 210 identifies whether a custom mode is set to correspond to the identified reproduction path. If the custom mode is not set, that is, if a general mode is set, the audio table selection and application unit 210 proceeds to step 305 to apply a basic audio table to a corresponding reproduction path.

On the other hand, if the custom mode is set to correspond to the reproduction path which is identified in step 301, the audio table selection and application unit 210 proceeds to step 307 and applies the custom audio table to the corresponding reproduction path.

Even if the general mode is set to correspond to the reproduction path which is identified in step 301, the audio table selection and application unit 210 proceeds to step 307 and applies the corresponding custom audio table when a request for a change of the general mode to the custom mode, i.e., an audio alteration signal, is made in the general mode during output of the audio. The process in step 307 will be described in more detail with reference to FIG. 4. In step 309, the audio table selection and application unit 210 identifies whether a reproduction path transfer occurs. If the reproduction path transfer does not occur, the audio table selection and application unit 210 continues to determine if the reproduction path transfer occurs until the voice calling is finished in step 311. As an example, the reproduction path transfer refers to a case in which a user transfers a calling mode from an ear-microphone mode to a speaker phone mode during the voice calling using the ear-microphone.

Figure 4:
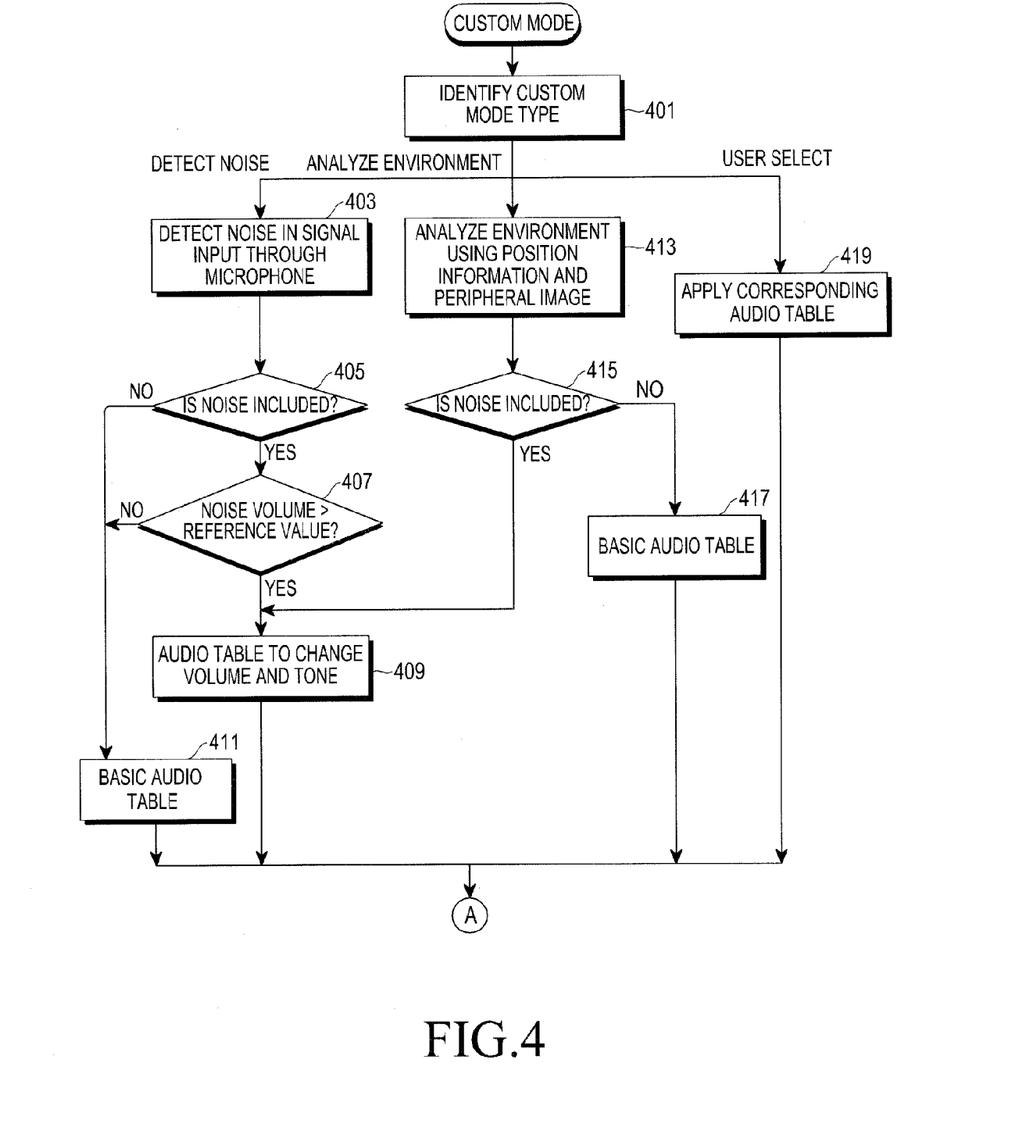
FIG. 4 is a flowchart illustrating a process of outputting audio signals in a custom mode according to an exemplary embodiment of the present invention.

FIG. 4 is a flowchart illustrating a process of outputting audio signals in a custom mode according to an exemplary embodiment of the present invention.

Referring to FIG. 4, the audio table selection and application unit 210 identifies a type of the custom mode in step 401. When the type of the custom mode is identified as a noise detection mode, the audio table selection and application unit 210 proceeds to step 403. In step 403, the audio table selection and application unit 210 detects noise from signals input through the microphone, and proceeds to step 405 to identify whether the noise is included in the signals. If the noise is included in the signals, the audio table selection and application unit 210 proceeds to step 407. In step 407, the volume of the noise is compared with a reference value. If the volume of the noise for an entire frequency band including the noise is smaller than the reference value, the audio table selection and application unit 210 proceeds to step 411. In step 411, the audio table selection and application unit 210 selects a basic audio table, and sets it to the output audio controller 220. On the other hand, if the volume of the noise in a part of the entire frequency band including noise is larger than the reference value, the audio table selection and application unit 210 proceeds to step 409. In step 409, the audio table selection and application unit 210 selects and applies an audio table which is capable of changing at least one of the volume and the tone, to the output audio controller 220. On the other hand, if it is determined in step 405 that the noise is not included in the signals, the audio table selection and application unit 210 proceeds to step 411 where it selects a basic audio table and sets it to the output audio controller 220.

Figure 6:
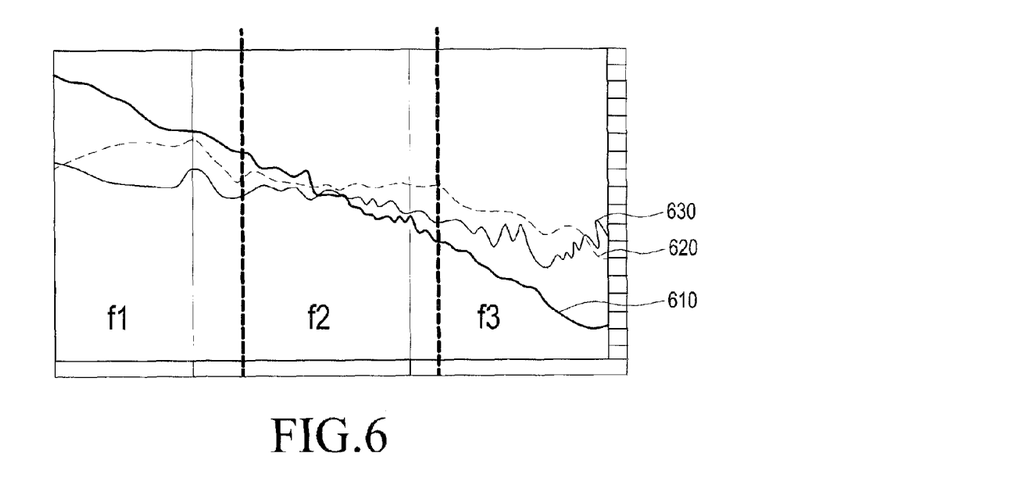
FIG. 6 is a view illustrating various kinds of noise signals which can be detected and an example of regulating the noise signals according to an exemplary embodiment of the present invention.

FIG. 6 is a view illustrating various kinds of noise signals which can be detected and an example of regulating the noise signals according to an exemplary embodiment of the present invention.

Referring to FIG. 6, an example in which a frequency band including noise is divided into three frequency sections in the names of f1, f2 and f3 is illustrated. In FIG. 6, a suitable audio table is selected based on the volume of the noise in each frequency section, where first noise 610 is detected on board a vehicle, second noise 620 is detected on a road, or third noise 630 is detected in a region such as a shopping mall in which a crowd is gathered.

When all frequency sections including the noise signals 610, 620 and 630 are smaller than the reference value, a basic audio table is selected. However, when only a volume of noise of the frequency section f1 is larger than the reference value, a tone change audio table is selected. Where only a volume of noise of the frequency section f2 is larger than the reference value, a volume change audio table is selected. In the remaining case excepting for the aforementioned-cases, a volume and tone change audio table is selected.

When the noise is detected, the volume value and tone value for the audio signals are suitably regulated so that definite audio signals can be output.

Referring again to FIG. 4, if the audio table selection and application unit 210 identifies that a type of the custom mode is in an environment mode in step 401, it proceeds to step 413. In step 413, the audio table selection and application unit 210 analyzes an environment using location information on the communication device 100 and peripheral images. As a result, in step 415, when it is determined that noise is included, the audio table selection and application unit 210 proceeds to step 409. When it is determined that noise is not included, the audio table selection and application unit 210 proceeds to step 417 to select and apply the basic audio table to the output audio controller 220.

Further, if the audio table selection and application unit 210 identifies that the type of the custom mode is in a user selection mode in step 401, the audio table selection and application unit 210 proceeds to step 419 and sets at least one of the volume value and the tone value to the audio controller 220 based on the custom audio table designated to correspond to the reproduction path.

For example, on the condition that the user selection mode is set, when a signal is input from the audio alteration button during a voice call or a video call, or during output of the audio signals through the audio output unit, the audio table selection and application unit 210 selects one of plural custom audio tables and applies the selected custom audio table to an active reproduction path. At this time, the custom audio table may be randomly selected each time when a signal of the audio table change button is input, or it may be sequentially selected in predetermined order. On the condition that the custom audio table is sequentially selected in a predetermined order, when selection for all custom audio tables is completed, the basic audio table can be selected, or a custom audio table designated by the user can be selected.

As described above, exemplary embodiments of the present invention provide a plurality of audio tables having different volume control values or tone control values so that the user can selectively set an audio table to correspond to an audio reproduction path equipped to the portable communication device. Further, exemplary embodiments of the present invention analyze an environment around the portable communication device during a voice call, and determine the absence or the presence of noise. As a result, exemplary embodiments of the present invention can regulate and output the volume or tone of the audio signals suitably.

Accordingly, exemplary embodiments of the present invention can provide an optimum call condition in a variety of calling environment.

Exemplary embodiments of the present invention can change the volume and tone of the audio signals which are output during a voice call, and regulate and output the volume or tone of the audio signals based on a voice call environment. Further, exemplary embodiments of the present invention allow the user to selectively set different audio tables to each reproduction path.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method of outputting audio signals of a communication device, the method comprising:
    detecting and analyzing noise from an environment around the communication device;
    selecting an audio table among a plurality of audio tables, the selected audio table including values for changing a tone and a volume of output audio signals received from another communication device through a voice telecommunication system, based on a user request, the selecting of the audio table comprising selecting a basic audio table when a volume value of a noise frequency band corresponding to the noise is smaller than a reference value; and
    changing the tone and the volume of the output audio signals according to the values included in the selected audio table,
    wherein the changing the tone and the volume of the output audio signals comprises relatively increasing a tone value and a volume value of the output audio signals in a predetermined frequency band, and
    wherein the basic audio table includes volume values which are different from one another and each of which correspond to each of plural levels.

2. The method of claim 1,
    wherein the detecting noise comprises detecting noise when an audio output mode, which corresponds to a reproduction path connected to an audio signal output processor, is in a noise detection mode; and
    wherein the selected audio table is selected based on a result of the analysis.

3. The method of claim 2, wherein the tone value indicates the tone of the output audio signals, and includes information on a volume of the output audio signals in a certain frequency band corresponding to the output audio.

4. The method of claim 3, wherein the detecting of the noise comprises detecting noise from audio signals which are input through a microphone.

5. The method of claim 4, wherein the selecting of the audio table comprises:
    dividing the noise frequency band into a plurality of frequency sections; and
    selecting at least one of a tone change audio table which includes a volume value of the basic audio table and a tone value for changing a tone of the output audio signals, and a volume change audio table which includes a volume value of the basic audio table and an added volume value corresponding to each level, when a volume of the noise is larger than the reference value as a result of comparing the volume of the noise in each of plural divided frequency sections with the reference value.

6. The method of claim 5, further comprising:
    identifying the absence or presence of the noise based on any one of information on a location of the communication device and a surrounding image taken by the communication device if the audio output mode is in an environment analysis mode; and
    selecting at least one of the tone change audio table and the volume change audio table when it is identified that the noise exists.

7. The method of claim 5, further comprising:
selecting a certain audio table set to correspond to the reproduction path if the audio output mode is in a user selection mode.

8. The method of claim 7, further comprising:
selecting the basic audio table if the audio output mode is in a general mode.

9. The method of claim 1, further comprising receiving the user request.

10. A communication device comprising:
an audio table selection and application processor configured to:
    detect and analyze noise from an environment around the communication device;
    select an audio table among a plurality of audio tables and select a basic audio table when a volume value of a noise frequency band corresponding to the noise is smaller than a reference value, the selected audio table including values capable of changing a tone and a volume of an output audio signal received from another communication device through a voice telecommunication system, based on a user request, and
    change the tone and the volume of the output audio signal according to the values included in the selected audio table; and
an output audio processor configured to relatively increase a tone value and a volume value of the output audio signals in a predetermined frequency band,
wherein the basic audio table includes volume values which are different from one another and each of which correspond to each of plural levels.

11. The communication device of claim 10, further comprising:
at least one audio signal output processor; and
a signal analyzer configured to detect noise based on an environment around the communication device,
wherein the audio table selection and application processor is configured to:
    control the signal analyzer in order to detect noise based on a peripheral environment if an audio output mode which corresponds to a reproduction path connected to the audio signal output processor is in a noise detection mode, and
    select the audio table based on the result of the noise analysis.

12. The communication device of claim 11, wherein the tone value indicates a tone of the output audio signal, and includes information on a volume of a certain frequency band corresponding to the output audio signal.

13. The communication device of claim 12, wherein the signal analyzer is configured to detect noise from an input audio signal which is input through a microphone.

14. The communication device of claim 13, wherein the audio table selection and application processor is configured to:
    divide the noise frequency band into a plurality of frequency sections, compares a noise volume of each frequency section with the reference value, and
    select at least one of a tone change audio table which includes the volume values of the basic audio table and a tone value capable of changing a tone of the output audio signal and a volume change audio table which includes the volume values of the basic audio table and added volume values respectively corresponding to each of the levels.

15. The communication device of claim 14, wherein the audio table selection and application processor is configured to:
    identify the absence or presence of the noise based on any one of information on a location of the communication device and a surrounding image taken by the communication device if the audio output mode is in an environment analysis mode, and
    select at least one of the tone change audio table and the volume change audio table when the presence of the noise is identified.

16. The communication device of claim 15, wherein the audio table selection and application processor is configured to select a certain audio table set to correspond to the reproduction path if the audio output mode is in a user selection mode.

17. The communication device of claim 16, wherein the audio table selection and application processor is configured to select the basic audio table if the audio output mode is in a general mode.

18. The communication device of claim 10, further comprising an input/output device configured to receive the user request.

* * * * *